(12) United States Patent
Heinzmann et al.

(10) Patent No.: US 7,449,077 B2
(45) Date of Patent: Nov. 11, 2008

(54) METHOD FOR THE PRODUCTION OF MONOLITHIC MULTILAYER ACTUATOR MONOLITHIC MULTILAYER ACTUATOR MADE OF A PIEZOCERAMIC OR ELECTROSTRICTIVE MATERIAL AND EXTERNAL ELECTRICAL CONTACT FOR A MONOLITHIC MULTILAYER ACTUATOR

(75) Inventors: Astrid Heinzmann, Gera (DE); Eberhard Hennig, Stadtroda (DE); Daniel Kopsch, Grosstreben-Zwethau (DE); Patrick Pertsch, Hermsdorf (DE); Stefan Richter, Hirschberg (DE); Eike Wehrsdorfer, Eisenberg (DE)

(73) Assignee: Pi Ceramic GmbH Keramische Technologien und Bauelemente, Lederhose (DE)

( * ) Notice: Subject to any disclaimer, the term of this patent is extended or adjusted under 35 U.S.C. 154(b) by 378 days.

(21) Appl. No.: 10/517,192

(22) PCT Filed: May 14, 2003

(86) PCT No.: PCT/EP03/05051

§ 371 (c)(1),
(2), (4) Date: Jul. 27, 2005

(87) PCT Pub. No.: WO03/105246

PCT Pub. Date: Dec. 18, 2003

(65) Prior Publication Data

US 2006/0055288 A1 Mar. 16, 2006

(30) Foreign Application Priority Data

Jun. 7, 2002 (DE) ................................. 102 25 405
Jul. 30, 2002 (DE) ................................. 102 34 787

(51) Int. Cl.
H01L 41/24 (2006.01)
(52) U.S. Cl. ............... 156/89.12; 156/89.14; 156/89.16
(58) Field of Classification Search .............. 156/89.12, 156/89.14, 89.16, 89.23; 310/364, 366
See application file for complete search history.

(56) References Cited

U.S. PATENT DOCUMENTS

| 5,237,239 | A  | * | 8/1993 | Inoue et al. | .................. 310/328 |
| 6,208,026 | B1 | * | 3/2001 | Bindig et al. | ................ 257/718 |
| 6,411,018 | B1 | * | 6/2002 | Heinz | .......................... 310/363 |
| 6,731,050 | B2 | * | 5/2004 | Bindig et al. | ................ 310/366 |

(Continued)

FOREIGN PATENT DOCUMENTS

DE 39 40 619 12/1990

(Continued)

*Primary Examiner*—Melvin C Mayes
(74) *Attorney, Agent, or Firm*—Oblon, Spivak, McClelland, Maier & Neustadt, P.C.

(57) ABSTRACT

The invention relates to a method for the production of a monolithic multilayer actuator, a corresponding monolithic multilayer actuator, as well as an external contact for a monolithic multilayer actuator. According to the invention specific microdisturbances are incorporated in the actuator structure along the longitudinal axis of the stack essentially parallel and spaced to the inner electrodes in the area of the at least two opposite outer surfaces to which the inner electrodes known per se are brought out, which at the earliest during polarisation of the actuator are subject to a pregiven, limited, stress-reducing growth into the interior and/or towards the outer electrode, wherein additionally the basic metallic coating and/or the external contact is formed elongation-resistant or elastic at least in the area of the microdisturbances.

12 Claims, 3 Drawing Sheets

U.S. PATENT DOCUMENTS

Figure 1:
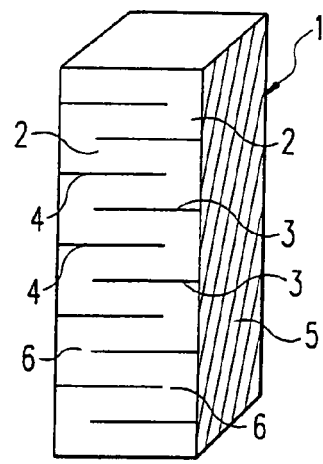

| | | | | |
|---|---|---|---|---|
| 7,276,841 B2* | 10/2007 | Takaoka et al. | ............. | 310/363 |
| 2002/0043901 A1* | 4/2002 | Kihara et al. | ............... | 310/366 |
| 2003/0080651 A1* | 5/2003 | Murai et al. | ................ | 310/328 |
| 2005/0280336 A1* | 12/2005 | Mochizuki et al. | .......... | 310/366 |
| 2006/0232172 A1* | 10/2006 | Asano et al. | ................ | 310/366 |
| 2006/0238073 A1* | 10/2006 | Ragossnig et al. | .......... | 310/328 |

FOREIGN PATENT DOCUMENTS

| | | | |
|---|---|---|---|
| EP | 0 479 328 | | 4/1992 |
| EP | 0 844 678 | | 5/1998 |
| EP | 1 204 152 | | 5/2002 |
| EP | 1 850 403 | * | 10/2007 |

\* cited by examiner

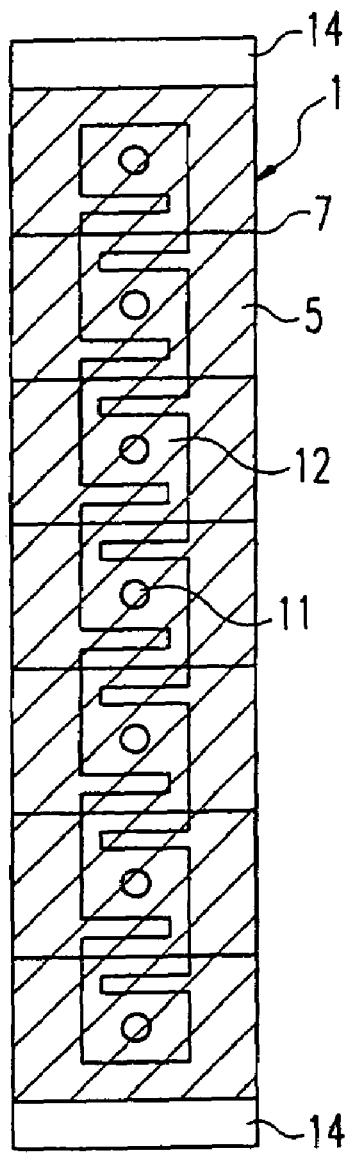
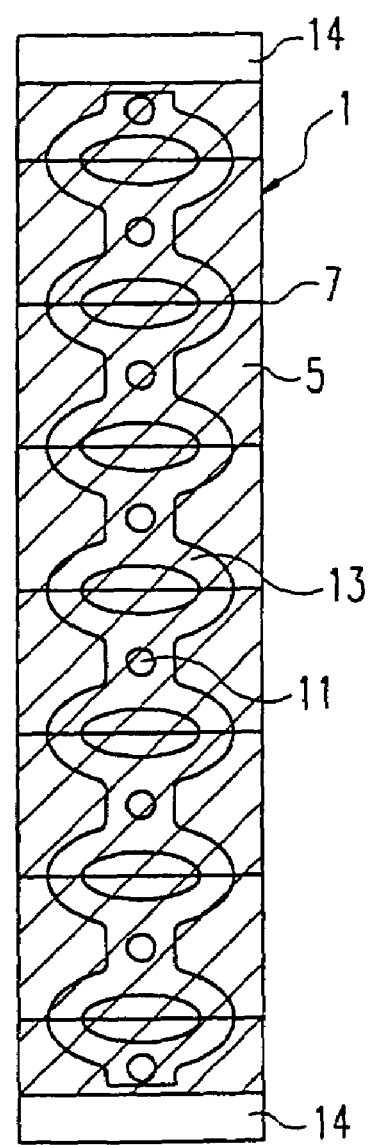
Fig. 3a                    Fig. 3b

METHOD FOR THE PRODUCTION OF MONOLITHIC MULTILAYER ACTUATOR MONOLITHIC MULTILAYER ACTUATOR MADE OF A PIEZOCERAMIC OR ELECTROSTRICTIVE MATERIAL AND EXTERNAL ELECTRICAL CONTACT FOR A MONOLITHIC MULTILAYER ACTUATOR

The invention relates to a method for the production of a monolithic multilayer actuator made of a piezoceramic or electrostrctive material, with the actuator being formed as a stack arrangement in a quasi mechanical series connection of a plurality of piezoplates by sintering of green foils, existing inner electrodes in the plate stack being routed to opposite outer surfaces of the stack, where they are connected in parallel by a basic metallic coating as well as an external contact of respective electrode groups. The invention also relates to a monolithic multilayer actuator made of a piezoceramic or electrostrictive material, with the actuator being a stack arrangement of piezoplates which comprises inner electrodes, a common basic metallic coating, as well as an electrical external contact, as well as to an external contact for a monolithic multilayer actuator made of a piezoceramic or electrostrictive material.

Piezoceramic actuators are electro-mechanical transducers which utilise the reciprocal piezoelectric effect. If an electric field is applied to a piezoelectric plate with electrodes on its main surfaces, which is polarised in the direction of the plate thickness, a change in form will occur. Actually, an elongation in the direction of the plate thickness takes place if the applied electric field is oriented parallel to the original polarising field. Simultaneously, a contraction takes place perpendicular to the direction of the field.

By stacking a plurality of such plates one above the other in the sense of a mechanical series connection and an electric parallel connection of the plates it is therefore possible to add the deformations of the individual plates. With an elongation capability of approx. 0.1 to 0.2% at field strengths von 2 kV/mm, deflections of approx, 1 to 2 µm per mm overall height may be realised.

With monolithic multilayer actuators, stacking is effected already in the green condition and the final connection is made by sintering. In this process, up to several hundreds of piezoceramic green foils are alternately stacked with metallic inner electrodes, compacted, and sintered to a monolithic body. The inner electrodes are alternately brought out to the opposite areas as far as to the respective surface where they are generally connected with each other by a basic metallic coating in thick or thin film design. This design is also referred to as configuration with interdigital electrodes. A piezoelectric actuator thus comprises piezoceramic layers and groups of inner electrodes each of which extending to opposite areas as far as to the surface. A basic metallic coating serves for the parallel connection of the respective electrode group. In addition, inactive areas are provided which are neither expanded upon polarisation nor during normal operation of the actuator.

These inactive areas in the multilayer actuators with interdigital electrodes represent a critical factor for a feasible manufacture and reliability of such products, or of final products, respectively, which are realised under the utilisation of such products. Due to the high tensile stress concentrations in the inactive areas and in view of the low tensile strength of the piezoceramic materials, undesired cracking occurs already during polarisation which involves remanent elongations of up to 0.3% or later during operation.

The above mentioned uncontrolled cracking results in the most different failures mechanisms of the actuators. If the crack growth propagates into the interior of the actuator, this may result in the mechanical destruction of the actuator, on the one hand, and, on the other hand, it may lead to internal flashes if the cracks grows from one electrode layer to the other one. With a suitable process management, the crack growth into the interior of the actuator may be limited. That which cannot be avoided, however, is the crack growth towards the actuator surface. If the crack reaches the actuator surface, this results in an interruption of the basic metallic coating applied to the surface. Partial areas of the actuator will thereby be galvanically isolated from the voltage supply, and due to this, electric flashed will occur at the interruptions of the basic metallic coating. These flashes in turn are the reason which ultimately leads to the total failure of the actuator.

Numerous solutions for overcoming the discussed cracking problem have been known, which are either directed at preventing crack formation or, in the case of unavoidable uncontrolled crack formation, at reducing or eliminating flashes at the basic metallic coating to the surface by additional measures.

JP 58-196077 discloses a multilayer actuator and a method for its manufacture, in which a plurality of slots with a depth of approx. 0.5 mm is formed into the actuator parallel to the inner electrodes along the actuator axis. Similar to the expansion joints which are known from other fields of the art, these slots lead to a reduction in stress concentrations and thus prevent an uncontrolled crack formation or a growth of the crack in the actuator structure. The fact, however, that these slots also reduce the load bearing cross-section of the actuator and at the same time the pressure load capacity of the actuator during operation is disadvantageous. In the cited example, the load bearing cross-section of the actuator is reduced to 3×3 $mm^2$ with a total cross-section of 4×4 $mm^2$. The cited process by which the slots are formed by thermally decomposable layers on the green ceramic foils during sintering also indicates further problems which during sintering may lead to an uncontrolled crack growth as well, and which can be prevented only by special expensive configurations of the inner electrodes. As the cause for the crack formation during sintering, the inhomogeneous compaction of the green stack during compression is mentioned.

EP 0 844 678 A1 also discusses the problem of crack formation and its consequences if the basic metal coating is destroyed by the cracks.

In order to avoid damage of the actuator, it is proposed therein to insert a three dimensionally structured conductive electrode between the voltage supply and the basic metallic coating, which is only partially connected with the basic metallic coating and which is adapted so as to be expandable between the contact points. The practical realisation of such a three dimensional structure, however, requires very high expenditures because the partial contact points must have a defined distance in the order of the distance of the inner electrodes.

In the arrangement for a reliable contact making of piezoelectric actuators according to DE 196 46 676 C1 a conductive contact tag is attached at the basic metallic coating which is formed as contact strip in such a manner that a protruding portion of the contact tag remains. The protruding portion of the contact tag must be formed sufficiently large so that occurring cracks will not completely sever the contact tag. Such an arrangement is, however, very sensitive in handling. As is known, the basic metallic coating on the surface of the piezoelectric actuator has a very low peeling resistance. Already low peeling forces cause the separation of the basic metallic coating from the actuator surface and thus the partial or complete loss of the electric contact with the inner electrodes.

A further variant to decouple the crack growth from the actuator body to the surface electrode is disclosed in DE 100 17 331 C1. It is proposed therein to include a conductive powder layer between the basic metallic coating and the outer electrode. Although such an arrangement prevents the crack propagation, it can technically be realised reliably only under considerable expenditures, because the electric contact of the powder particles with the inner and outer electrode and among each other is made via physical contact only, which requires a minimum contact pressure. Contacting contacts are also very susceptible to corrosion phenomena.

WO 00-79607 A1 and WO 00-63980 A1 disclose solutions which are directed to individually contact each electrode brought out to the surface. With electrode distances of 50 to 250 μm this cannot be realised economically.

Based on the above, it is therefore the object of the invention to provide a method for the production of a monolithic multilayer actuator made of a piezoceramic or electrostrictive material, by means of which it can be achieved to create an actuator with high reliability and long term stability which is also capable of withstanding high pressure forces with a small actuator cross-section. It is further the object of the invention to provide a monolithic multilayer actuator made of a piezoceramic or electrostrictive material, with this novel actuator having improved operating properties.

Finally, an external electrical contact for a monolithic multilayer actuator is to be provided which effectively prevents the occurrence of flashes due to crack propagations as far as into the basic metallic coating, and which can be manufactured by means of the usual processes of the electronics industry.

The basic idea of the invention is to incorporate microdisturbances in the actuator structure along the actuator axis and essentially parallel to the inner electrodes in the area of the at least two opposite outer surfaces to which the inner electrodes are alternately brought out in such a manner that these act as crack sources located quasi at a pre-known site, with the crack growth being controllable. The external contact is formed in a manner known per se by means of a basic metallic coating in thick or thin film technology, with the electrode areas between the sites of the microdisturbances and potential cracks leading towards the outside being connected by an elongation-resistant second outer electrode.

By the specific incorporation of structure impairments which act as potential crack source, any further crack formation can specifically be controlled. With a distance of the crack sources ranging from 1 to 4, preferably from 2 to 3 mm, the internal mechanical stresses are reduced in such a manner that in the portions between the crack sources no further crack formation is observed, even at a cyclic load exceeding $10^9$ cycles by far.

With respect to the invention, it is of importance that the microdisturbances themselves which are incorporated in a specific controlled manner do not present a crack in the proper sense in the actuator structure. The specifically controlled crack occurs only after the polarisation of the actuator and only to the extent in which remanent elongations are present. Due to the fact that the structure is still closed in the step of the application of the basic metallic coating, no metallising compound penetrates into the piezoceramic material, which results in a considerable quality improvement of actuators realised in this manner.

The microdisturbances prevent locally limited that the green foils are sintered together with the result of a distinct delamination.

In order to achieve this delamination, there is the possibility to apply a layer or quantities of an organic binder in the area of the desired microdisturbances upon the build-up of the stack, which include(s) up to 50% by volume organic particles with a diameter $\leqq 200$ nm, which during the sintering process burn off almost completely.

This specified layer can be applied by screen printing and is compacted prior to sintering in such a manner that the ceramic particles embedded in the green foils contact each other only partially or not at all in order to explicitly prevent a complete or partial sintering together.

Alternatively, there is the possibility to form the microdisturbances by a plurality of inorganic filler particles with a diameter of $\leqq 1$ μm, with these filler particles not reacting with the piezoelectric material of the stack. The filler particles are added to the binder in a manner known per se and are a constituent of the latter.

In still another embodiment, there is the possibility to induce the microdisturbances by incipient notches, with these incipient notches being generated either in the green or in the sintered condition, without, however, reducing the load bearing cross-sectional area of the actuator stack.

Due to the fact that the location of potential cracks is known by the defined incorporation of the microdisturbances, there is the possibility to design the external contact with the knowledge of this position or location. According to the invention, the external contact consists of a plane articulated bending electrode which is electrically connected with the basic metallic coating at least in the area between the microdisturbances.

Practically speaking, the plane bending electrode may comprise a soldered copper/beryllium strip, with the strip comprising sections in the shape of open ellipses. The main axis of the respective open ellipses extends in the area of the respective microdisturbance.

In an alternative, the bending electrode is designed as a meander or double meander electrode, with the connecting portions of the meander extending in the area of the microdisturbances.

On the bending electrode, soldering portions or soldering pads are provided for contacts with the basic metallic coating and/or for further wiring.

The stack arrangement which forms the actuator includes electrode-free passive end layers as force coupling surfaces.

The distance of the first microdisturbance to the passive end layer equals the entire or half the distance of the remaining microdisturbances which are distributed along the longitudinal axis.

The inventive multilayer actuator made of a piezoceramic or electrostrictive material comprises microstructure disturbances along the stack longitudinal axis which are deliminating essentially parallel to the inner electrode, with the tensile strength being reduced there compared to the surrounding structure, while the compression strength of the stack is maintained.

In addition, the monolithic multilayer actuator includes elongation resistant plane outer electrodes which are only punctually connected with the basic metallic coating in the area between the delaminating microstructure disturbances.

In an embodiment, the outer electrode may be designed as a meander or double meander with a bending articulation function. There is also the possibility to form this outer electrode as a series of open ellipses in the sense of an ellipses ring with bending articulation function, with a connecting and contacting web extending essentially in the direction of the minor axes.

The main axis of the respective open ellipses of the outer electrode extends essentially in the area of the microstructure disturbances. Any cracks which might originate there propagating to the outside do not result in an electrical interruption of the contact.

Passive end layers which are formed at the upper and/or lower end of the actuator can be formed as a monolithic insulating layer which carries or accommodates coupling elements.

The inventive electrical external contact for a monolithic multilayer actuator consists of outer electrodes in the form of elongation-resistant, quasi elastic, conductive strips, respectively, which are only punctually connected with the basic metallic coating, which have a plurality of individual bending articulations located in one plane. The strips are made e. g. from a copper/ beryllium alloy or consist of a material with equivalent properties.

In summary, the solution approach is to provide for specific structure impairments in the actuator material so that cracks originate at the then known sites, but initially only then when the actuator is subjected to a polarisation. Due to the fact that the site of the cracks which have been created in a specific controlled manner is known, a corresponding expandable electrode configuration may provide for a reliable electrical contact making under all circumstances or for maintaining same.

As it is known, the crack growth takes place essentially perpendicular to the actuator longitudinal axis and in both directions, i. e. both into the interior of the actuator and towards the outside to the basic metallic coating. Usually, this is an adverse effect. Because the external contact according to the invention can be modified due to the known site of the cracks, potential cracks can be bridged from the beginning, and the failure phenomena as known in the state of the art are reduced.

According to the state of the art it is necessary to form as many notches or slots as possible, in particular in the end region of the actuator as well, because the stress conditions in the actuator itself are not known. Each of the notches or slots to be formed, however, leads to a reduced mechanical stability and thus loadability of the actuator itself.

Though in the present invention controlled changes of the structure are incorporated which potentially might result in a crack if relevant stresses occur, this cannot be compared with a mechanical impairment of the structure which is unavoidable from the beginning by a slot which is generated e. g. by milling, notching or the like. The slots known in the state of the art represent a material removal. The area of the actuator in which material has been removed, however, apparently no longer contributes to its strength.

In the case in which larger particles which prevent sintering together are added into the binder layer, the advantageous effect remains that loadability or force acceptance by these particles is ensured which contribute in a non negligible extent to the overall stability. In this context, it is of importance that in the actuator itself only pressure forces in the direction of the longitudinal axis are of interest.

The incipient notches according to the invention are by no means comparable with the macroscopic notches according to the state of the art. The former are rather impressions in the order of micrometers which may quasi be compared with the impressions of a test specimen as are known from material testing.

As has been explained above, care must be taken that upon stacking of the individual foils a delamination effect occurs between selected areas of the foils or layers. This means that a tensile stress is not possible there, but that the neighbouring foils are arranged so closely one above the other that a transmission of the pressure force becomes possible, which is contrary to the areas with slot or notch according to the state of the art.

In an embodiment the distance between two alternately brought out electrodes in an upper and/or lower end region of the actuator may be twice as large as that from neighbouring electrodes arranged below them. Due to the larger distance, the propagation of a crack caused by the changed microstructure into the electrode region and thus an interruption of the electrode in the interior of the actuator can be prevented. The disadvantage of a different field strength which prevails there is in any case compensated by the advantage of the active contribution in performance of the actuator in this region.

Figure 2A:
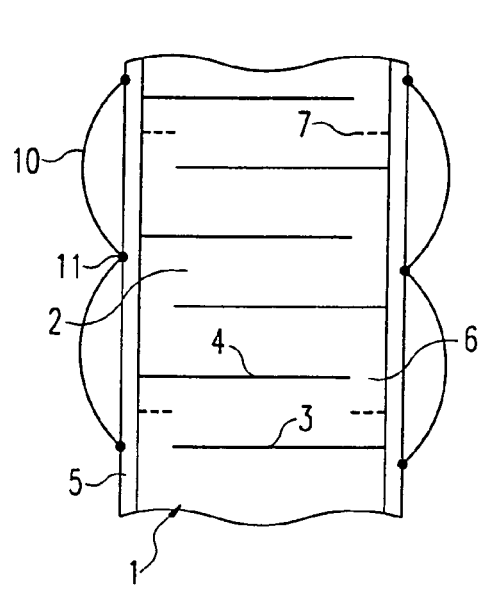
Figure 2B:
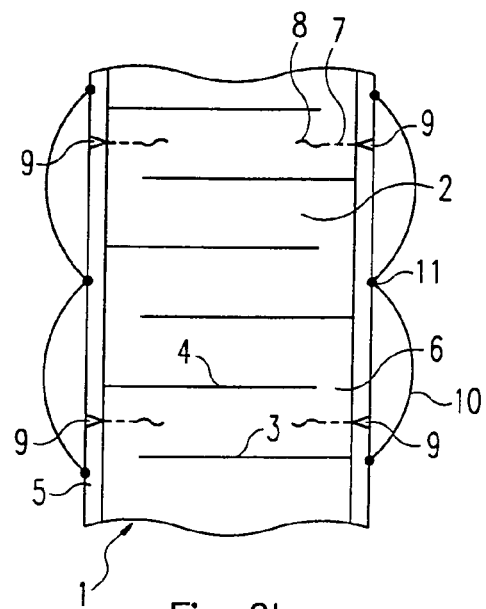
Figure 4A:
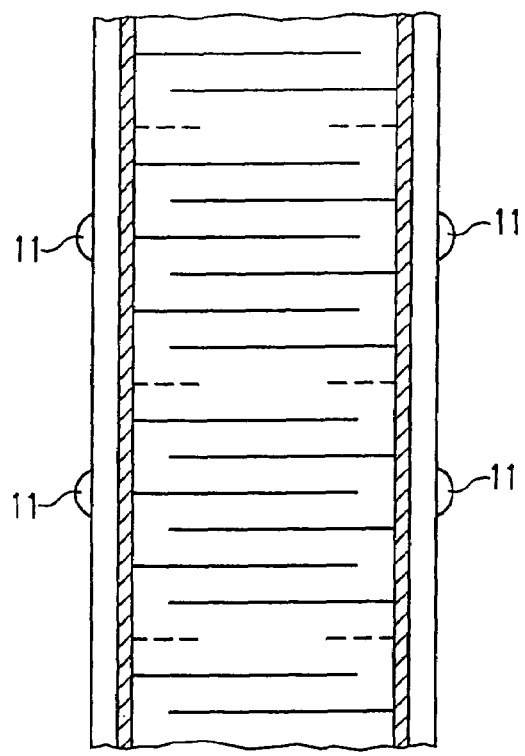
Figure 4B:
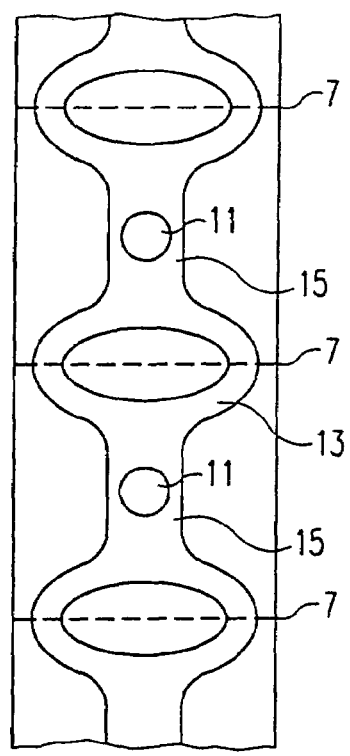

The invention will be explained more detailed in the following with reference to embodiments as well as to figures; in which:

FIG. 1 shows a principal stacked actuator arrangement according to the state of the art;

FIG. 2*a* shows an actuator according to the invention prior to polarisation;

FIG. 2*b* shows an actuator after polarisation;

FIG. 3*a* shows an embodiment of the external contact with meander electrode;

FIG. 3*b* shows an embodiment of the outer electrode with open ellipses;

FIG. 4*b* is a sectional view of an inventive actuator with changed distance of opposite inner electrodes in pregiven end regions; and FIG. 4*b* is a side view of a portion of an inventive actuator with a visible electrode arrangement in the form of bending articulations, designed as open ellipses joined by webs.

The embodiment of a multilayer actuator according to the state of the art shown in FIG. 1 is based on an interdigital electrode arrangement. Reference numeral 1 identifies the actuator itself, reference numeral 2 identifies the piezoceramic layers. The inner electrodes 3 and 4 each are brought out to the opposite areas up to the surface. The basic metallic coating 5 serves as the parallel connection of the respective electrode group. An inactive area 6 of the actuator 1 is neither piezoelectrically elongated upon polarisation nor during operation of the actuator 1 and constitutes a stress crack potential.

The inventive actuator according to the embodiments of FIGS. 2*a* and 2*b* comprises piezoceramic layers 2 with a thickness ranging from 20 to 100 μm. These layers are connected with each other by inner electrode 3 and 4 which preferably consist of an AgPd alloy, and are alternately brought out to opposite surfaces.

The brought out electrodes 3, 4 are connected via a basic metallic coating 5 which is applied to the lateral surfaces, so that an electrical parallel connection of the individual piezoelectric layers results.

In the area 6 of the electrodes 3, 4 which are not brought out to the surface, mechanical stress concentrations, in particular tensile stresses, originate due to the inhomogeneous electrical field distributions in a known manner during polarisation or operation of the actuator, which ultimately are the cause for an undesired, uncontrolled crack formation.

By the specific incorporation of structural impairments which act as a crack source 7, the crack formation can be controlled.

With a distance of the crack sources 7 ranging from 1 to 4 mm, preferably from 2 to 3 mm, the internal mechanical stresses can be reduced in such a manner that no further crack formation is observed in the portions between the crack sources, even with loads exceeding $10^9$ cycles by far.

FIG. 2b shows the inventive actuator after polarisation. Here, the stress relieve effect is schematically shown. From the crack source 7, on the one hand, a specific cracks growth 8 propagates into the interior of the actuator, which is automatically stopped or interrupted by a suitable energy reducing structure via the specification of grain sizes and porosity.

On the other hand, however, a crack growth into the basic metallic coating occurs at a site 9, which in the most unfavourable case leads to severance of the basic metallic coating 5.

In the illustrated embodiment the electrical connection of the individual portions is effected by a wire 10 which is routed in the shape of an arc, which is punctually connected with the basic metallic coating via a solder pad 11.

The above mentioned crack sources can be implemented in the actuator in various manners. Principally, a partial or complete sintering together of the stacked and compressed green foils has to be prevented at predetermined sites so that at these sites the tensile strength can be reduced relative to the surrounding structure. The above is achieved in that in the predetermined areas a layer of an organic binder is applied by screen printing during the build-up of the stack, which is filled with up to 50% by volume with organic particles with a diameter <200 nm, which will completely burn off during sintering.

In the further process or processing steps, this layer is compacted during compression to a thickness <1 μm and provides for no or only partial contact of the ceramic bodies embedded in the green foils so that during sintering the material transport from one grain to the other is prevented completely or partially.

An alternative possibility is to add inorganic particles to the binder in lieu of organic filler particles, with a diameter <1 μm which do not react with the piezoelectric material, such as $ZrO_2$ or powder of a sintered PTZ material with a composition which is essentially the same as that of the actuator material.

Crack sources can also be generated by making incipient micronotches either in the green or in the sintered condition.

The above described relieve of internal mechanical stresses by a specific incorporation of cracks into the actuator has considerable advantages compared to the known solutions. For example, the loadable cross-section of the actuator is reduced only negligibly because the specifically generated crack surfaces are pressed together in the direction of the actuator axis upon the application of a pressure force and thus contribute to the load bearing crosssection.

Another advantage is that the crack opens at the earliest upon polarisation so that no metal particles can penetrate into the interior of the actuator during the application of the basic metallic coating. This results in a considerably improved quality of correspondingly designed actuators compared to the state of the art.

It is also advantageous that a simple elongation-resistant outer electrode may be realised for a reliable electrical contact with long-term stability, which is to be connected only punctually with the basic metallic coating between the stress relieve cracks.

FIG. 3a shown an embodiment of an elongation-resistant or elastic, respectively, outer electrode 12 in slot or meander shape. There, passive end layers 14 without internal electrodes are shown which form a force coupling surface. These end layers 14 may, e. g. consist of a monolithic insulating material and serve to accommodate various coupling elements.

FIG. 3b also shows an embodiment of the actuator provided with passive end layers 14.

There, an outer electrode in the form of open ellipses comprising solid body articulations is provided. The main axis of the respective open ellipsis extends essentially in the area of expected cracks. The individual ellipses comprise webs 15 which serve as electrical contacts among the ellipses 13. In the areas of the webs 15 a solder pad 11 each is formed.

According to the embodiment of FIG. 3a, the distance from the first stress relieve crack 7 to the passive end layer 14 is selected equal to the distance of the stress relieve cracks among each other. In the second embodiment according to FIG. 3b the distance of the first stress relieve crack 7 to the passive end layer 14 equals half the distance of the remaining stress relieve cracks from one another.

FIG. 4a discloses a larger distance of the inner electrodes 3 and 4 in certain portions of the actuator. This double distance compared to neighbouring inner electrodes reduces the risk that a crack 7 present in between propagates towards the inner electrodes and interrupts their contact towards the basic metallic coating or a corresponding electrical connection, respectively.

The plane design of the outer electrode made e. g. from a copper-beryllium material, which is schematically shown in FIGS. 3a and 3b is intended as an example only. Generally, any plane outer electrode is suitable which is capable of accommodating tensile or stress forces in the lateral direction without destruction.

LIST OF REFERENCE NUMERALS

1 Actuator
2 piezoceramic layer
3, 4 inner electrodes
5 basic metallic coating
6 inactive area of the actuator
7 microstructure change
8 specific microcrack initiated by polarisation
9 interruption of the basic metallic coating
10 wire routed in the shape of an arc
11 solder pad
12 meander-shaped outer electrode
13 ellipse of a correspondingly formed outer electrode
14 end areas of the actuator, preferably formed as a monolithic insulating layer
15 connection webs of the elliptical shape—external contact

The invention claimed is:

1. A method for the production of a monolithic multilayer actuator a comprising a piezoceramic or electrostrictive material, with the actuator being formed as a stack arrangement in a quasi mechanical series connection of a plurality of piezoplates by sintering of green foils, existing inner electrodes in the plate stack being routed to at least two opposite outer surfaces of the stack, where they are connected in parallel by a basic metallic coating as well as an external contact of respective electrode groups, wherein specific microdisturbances are incorporated in the actuator structure along the longitudinal axis of the stack essentially parallel and spaced from the inner electrodes in the area of the at least two opposite outer surfaces to which the inner electrodes known per se are brought out, which at the earliest during polarisation of the actuator are subject to a pregiven, limited, stress-reducing growth into the interior of the actuator;

wherein the microdisturbances permit transmission of pressure, but not tensile stress, between the piezoplates; and wherein additionally the external contact is formed elongation-resistant or elastic at least in the area of the microdisturbances.

2. The method according to claim 1, wherein
at the microdisturbances green foils are not sintered together.

3. The method according to claim 2, wherein
a layer or quantity of an organic binder is applied during build-up of the stack in the area of the microdisturbances, with up to 50% by volume of organic particles with a diameter $\leq 200$ nm which during the sintering process burn off nearly completely.

4. The method according to claim 3, wherein
the layer is applied by means of screen printing, with this layer being compacted prior to sintering in such a manner that the ceramic particles embedded in the green foils contact each other only partially or not at all in order to explicitly prevent a complete or partial sintering together.

5. The method according to claim 2, wherein
microdisturbances are formed by a quantity of inorganic filler particles with a diameter of $\leq 1$ μm which do not react with the piezoelectric material of the stack, with these filler particles being added to the binder.

6. The method according to claim 2, wherein
the microdisturbances are induced by incipient notches, which are generated either in the green or in the sintered condition, without, however, reducing the load bearing cross-sectional area of the actuator stack.

7. The method according to claim 1, wherein
the external contact is prepared with the knowledge of the position of the incorporated or intended microdisturbances, with the external contact comprising a plane bending articulated electrode which is punctually or with portions in electrical connection with the basic metallic coating at least in the area of the microdisturbances.

8. The method according to claim 7, wherein
the bending electrode consists of a soldered copper/beryllium strip and the strip comprises sections in the shape of open ellipses, with main axis of the respective open ellipsis extending in the area of one of the microdisturbances.

9. The method according to claim 7, wherein
the bending electrode is designed as meander or double meander electrode, with the connecting portions of the meander extending in the area of the microdisturbances.

10. The method according to claim 7, wherein
soldering portions or soldering pads are provided on the bending electrodes for further wiring.

11. The method according to claim 1, wherein
electrode-free passive end layers as force coupling surfaces are applied on the stack arrangement.

12. The method according to claim 11, wherein
the distance of the first microdisturbance to the passive end layer is selected to equal the total or half the distance of the remaining microdisturbances distributed over the longitudinal axis.

* * * * *